United States Patent

Cowan et al.

[11] Patent Number: 6,140,581
[45] Date of Patent: *Oct. 31, 2000

[54] GROUNDED PACKAGED SEMICONDUCTOR STRUCTURE AND MANUFACTURING METHOD THEREFOR

[75] Inventors: Joseph W. Cowan; Tom Taylor; J. Neil Schunke, all of Durham, N.C.

[73] Assignee: Mitsubishi Electronics America, Inc., Cypress, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/984,076

[22] Filed: Dec. 3, 1997

[51] Int. Cl.⁷ .................................................. H01L 23/02
[52] U.S. Cl. .................. 174/52.4; 174/16.3; 361/212; 361/220; 361/222; 361/707; 439/507; 439/508; 439/509; 439/510; 165/80.3; 165/185
[58] Field of Search ................................. 361/212, 220, 361/222, 707; 435/507–515; 165/80.3, 185; 174/16.3, 52.4

[56] References Cited

U.S. PATENT DOCUMENTS

| | | | |
|---|---|---|---|
| 3,919,553 | 11/1975 | Cohen et al. | 250/311 |
| 4,727,452 | 2/1988 | Brownlee | 361/224 |
| 4,733,632 | 3/1988 | Ohmi et al. | 118/729 |
| 4,739,448 | 4/1988 | Rowe et al. | 361/386 |
| 4,945,447 | 7/1990 | Aronson | 361/212 |
| 4,985,719 | 1/1991 | Tsurukawa et al. | 354/174 |
| 4,992,661 | 2/1991 | Tamura et al. | 250/307 |
| 5,163,850 | 11/1992 | Cronin | 439/507 |
| 5,285,352 | 2/1994 | Pastore et al. | 361/707 |
| 5,289,336 | 2/1994 | Gagliano | 361/220 |
| 5,302,828 | 4/1994 | Monahan | 250/307 |
| 5,357,116 | 10/1994 | Talbot et al. | 250/309 |
| 5,357,397 | 10/1994 | Leary | 361/220 |
| 5,357,402 | 10/1994 | Anhalt | 361/753 |
| 5,449,915 | 9/1995 | Yamada et al. | 250/397 |
| 5,469,322 | 11/1995 | Seo | 361/220 |
| 5,537,031 | 7/1996 | Ganapol et al. | 324/158.1 |
| 5,560,780 | 10/1996 | Wu et al. | 118/728 |
| 5,576,538 | 11/1996 | Sakai et al. | 250/251 |
| 5,583,733 | 12/1996 | Cronin | 361/111 |

*Primary Examiner*—Tan Nguyen
*Assistant Examiner*—Ronnie Mancho
*Attorney, Agent, or Firm*—Burns, Doane, Swecker & Mathis, L.L.P.

[57] ABSTRACT

An electrically grounded semiconductor structure is embedded in a non-conductive packaging material, without employing any electrical leads of the semiconductor structure as an electrical path and without damaging the semiconductor structure. The desired grounding connection is obtained by physically removing a portion of the non-conductive packaging material from a rear portion of the semiconductor structure, replacing the removed non-conductive material by a conformable electrically conductive material, and then electrically contacting this conformable electrically conductive material to a grounding element. In another aspect of the invention, a portion of the non-conductive packaging material is removed from a rear portion of the semiconductor structure and a metallic element such as a pin or a spring is disposed to make contact between the exposed portion of the semiconductor structure and the grounding element.

1 Claim, 3 Drawing Sheets

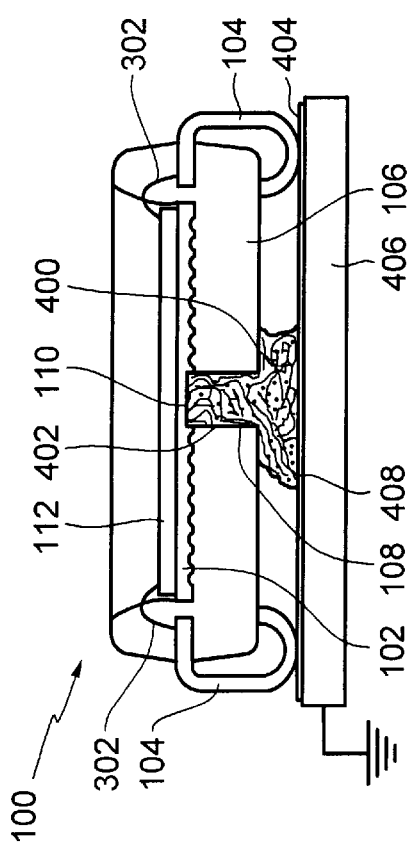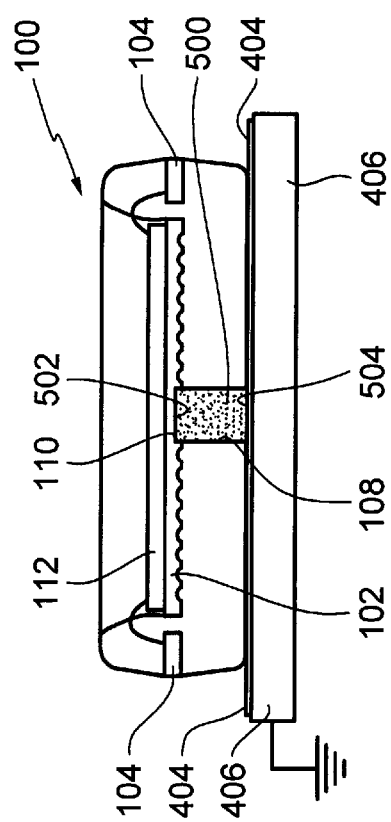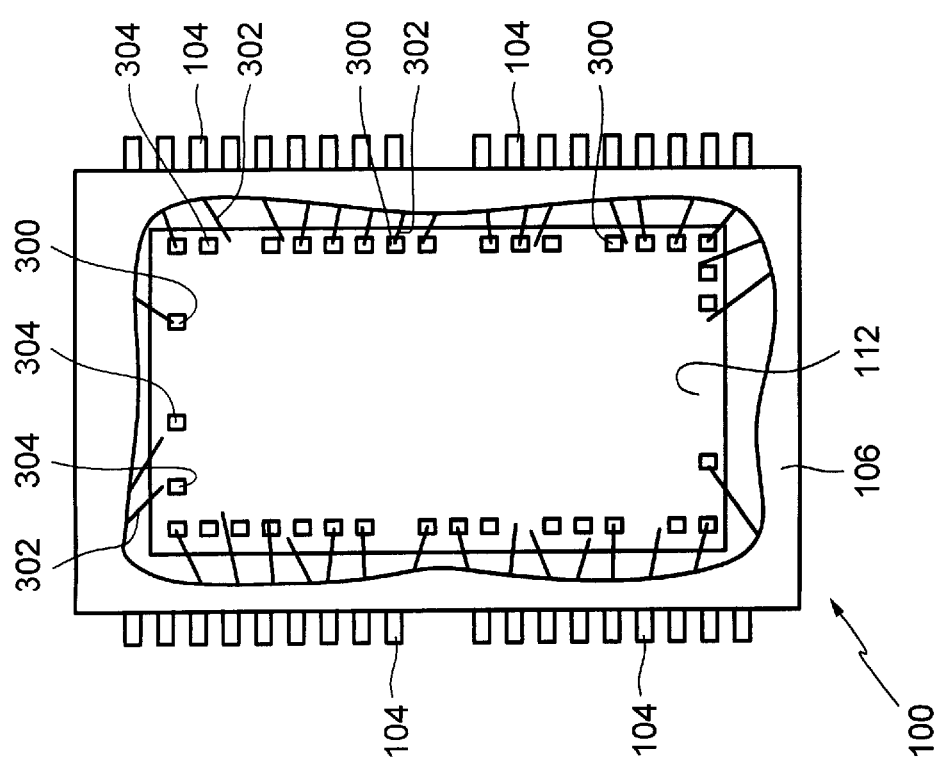

6,140,581

GROUNDED PACKAGED SEMICONDUCTOR STRUCTURE AND MANUFACTURING METHOD THEREFOR

FIELD OF THE INVENTION

This invention relates to a packaged semiconductor structure, e.g., a semiconductor chip, grounded so as to avoid inflicting harm thereto, for example, in failure analysis applications involving operational contact with analytical equipment such as a scanning electron microscope (SEM), a field ion beam (FIB) or a reactive ion etch (RIE).

BACKGROUND OF THE RELATED ART

In the semiconductor industry, it is a well-established practice to test selected components, typically semiconductor chips packaged in a non-conductive packaging material, using known failure analysis equipment/techniques such as SEM, FIB or RIE. A major problem encountered in such activity is that the failure analysis equipment/technique imposes a severe charge on the semiconductor structure to the point where the semiconductor structure may become damaged and/or disfunctional.

Currently known methods of grounding such a packaged semiconductor device, to reduce the type of charging encountered in the type of failure analyses discussed above, typically involves touching the semiconductor device with a conductive tape or a metal probe, thus often damaging the device being analyzed, or coating the device being analyzed with carbon or gold, the presence of which could represent a major alteration of the device being tested.

In this general area, there are various solutions known and practiced with varying degrees of success. The following are a few examples of such known teachings.

U.S. Pat. No. 5,583,733 to Cronin, titled "Electrostatic Discharge Protection Device" teaches a device which automatically connects selected connector pins of a semiconductor chip package to connectors on printed circuit boards so that the connected connector pins are held at a common voltage until insertion into a receptor or until insertion of a cable into the connector which overcomes an internal resilient bias of the electrostatic discharge protection device causing the common connection to be removed. This requires reliance on a plurality of pins working in cooperation, and is therefore not a particularly simple or easy solution to the need for effective grounding of the device being tested.

U.S. Pat. No. 5,469,322 to Seo, titled "Carbon Brush for Discharging Static Electricity", discloses a carbon brush which contacts a totally enclosed semiconductor device to discharge static electricity therefrom. This arrangement requires the carbon brush to make contact with an upper or exposed portion of the semiconductor device which is to be tested.

U.S. Pat. No. 5,357,397, to Leary, titled "Electric Field Emitter Device for Electrostatic Discharge Protection of Integrated Circuits", discloses a chip design methodology to build an electrostatic discharge device into the circuitry of a semiconductor ship mounted on a wafer. This methodology therefore requires intentional addition of complexity to the basic circuitry of the semiconductor chip.

U.S. Pat. No. 5,289,336, to Gagliano, titled "Static Electricity Dispersant", discloses a technique involving the pressing of a semiconductor device into a formable or deformable material to ground the device through its leads. The actual grounding connection is made via a snap or other device to ground, and the deformed material prevents charge build-up from being transferred to other connector devices. The deformable material is electrically conductive and makes contact by being pressed into place around or onto exposed contact leads of the semiconductor device.

Finally, U.S. Pat. No. 4,945,447, to Aronson, titled "Electrostatic Grounding System for Work Surfaces", discloses an electrostatic grounding system for work surfaces, such as tabletops, with an electrostatic discharge (ESD) pad or laminate covering. The system includes a grounded conductive plug in the work surface, an area of contact between the plug and a conductive layer of the work surface being maximized by providing the plug with a head having a tapered circumference which may include ridges.

None of the above-discussed exemplary known solutions provide an adequate degree of economy, ease-of-use, simplicity, or effectiveness considered desirable for safe failure analysis of numerous samples of packaged semiconductor devices. There is, therefore, a felt need for a method which meets all of these criteria.

SUMMARY OF THE INVENTION

Accordingly, it is a principal object of this invention to provide a simple, economical, easy-to-use, and highly reliable grounded packaged semiconductor device for safe failure analysis thereof with a known equipment/technique such as SEM, FIB, RIE, or even Energy Dispersive X-ray (EDX) analysis using an electron beam voltage above 10KV.

It is a related object of this invention to provide a safe failure analysis method by which a packaged semiconductor device, e.g., a semiconductor chip mounted on a lead frame provided with a plurality of leads, may be tested without using the leads as electrically conductive paths, by safely grounding the device lead frame during use of equipment/techniques which may otherwise deletriously charge the device during analysis procedures.

These and other related objects and purposes of this invention are realized by providing a method which includes the steps of:

removing a portion of the non-conductive material to thereby expose a selected portion of the semiconductor structure; replacing at least a portion of the removed non-conductor material by an electrically conductive conformable material making electrical contact with the exposed portion of the semiconductor structure; and contacting the electrically conductive conformable material to a grounding element, to thereby ground the semiconductor structure.

In another aspect of this invention, there is provided a method of grounding a packaged semiconductor device for analysis by a known equipment/technique involving, for example, SEM, FIB or EDX using an electron beam voltage above 10KV, comprising the steps of:

removing the non-conductive material from a rear portion of the semiconductor chip to expose a portion of the semiconductor chip; replacing a portion of the removed non-conductive material by an electrically conductive conformable material making electrical contact with the exposed portion of the semiconductor chip and conformably extending beyond the non-conductive material adjacent the exposed portion of the semiconductor chip; and conformably contacting the extended electrically conductive conformable material to a grounding element.

In yet another aspect of this invention there is provided a method of grounding a lead frame of a semiconductor device embedded in a non-conductive packaging material, comprising the steps of:

removing a portion of the non-conductive material to thereby expose a portion of the lead frame; providing a grounding element; and disposing an elastic metal element so as to make simultaneous contact thereby with the exposed portion of the lead frame and the grounding element, to thereby ground the lead frame.

A further aspect of the invention provides a grounded semiconductor device, comprising a semiconductor chip embedded in a package of non-conductive packaging material, the package having top and bottom surfaces, the bottom surface having an aperture extending to the chip. Electrically conductive conforming material in the aperture established contact with the chip and serves as a grounding element when the package is mounted.

DETAILED DESCRIPTION OF THE DRAWING

FIG. 3 is a top plan view of a SOJ structure after substantial decapsulation of its top side, to illustrate a situation in which at least some of the leads from the lead frame are no longer bonded to corresponding pads on the lead frame due to deprocessing, e.g., etching of aluminum on the bond pad, which reduces the ability of the device to be grounded through its own leads.

FIG. 4 is a transverse cross-sectional view of the SOJ per FIG. 1, disposed with a length of conductive tape placed in the milled hole to provide an electrical grounding path between a stage mount or grounding element and the lead frame of the device mounted thereon.

FIG. 5 is a transverse cross-sectional view of a decapsulated SOJ with leads ground/broken off the device for ease of handling with a quantity of a silver epoxy material filling the milled hole to provide an electrical grounding path between the stage mount or grounding element and the lead frame of the device.

DETAILED DESCRIPTION OF THE PREFERRED EMBODIMENTS

Figure 1:
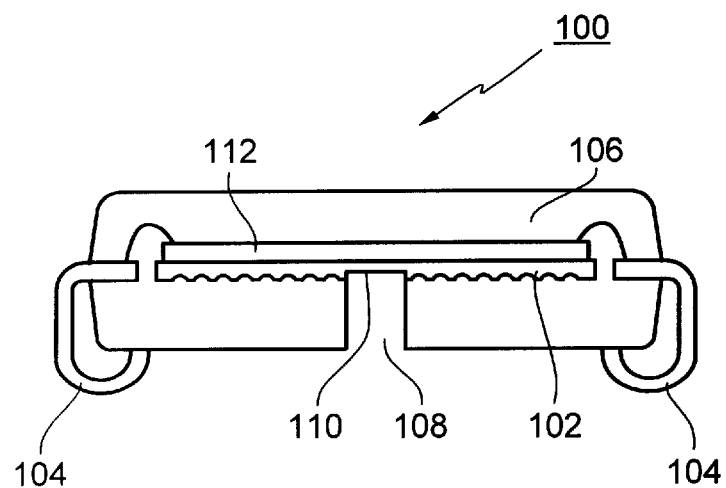
FIG. 1 is a transverse cross-sectional view of an exemplary small outline J-lead package (SOJ) in which a hole has been milled from a rear side through a non-conductive layer thereat to the lead frame of the device.

As best seen in FIG. 1, in practicing the present invention according to one of its preferred embodiments, an exemplary dual in-line package (SOJ) 100 comprises a lead frame 102 on which is formed a semiconductor structure 104, although in certain applications the lead frame 102 and semiconductor structure 104 may be regarded as a single semiconductor element. From either the lead frame 102 or the semiconductor structure 104 formed thereon (or from the integrated semiconductor element) there extend, on opposite sides, pluralities of electrical leads 104, 104. As the device is manufactured, it will have an outer body portion formed of a non-conductive material which may comprise, for example, ceramic, silicon, polymer material, resinous material, and the like 106. The resulting structure, except for exposed outwardly extending portions of leads 104, 104 may be generally cubical, ovoidal, or otherwise as suited to particularized needs.

In practicing the present invention in any of its preferred embodiments, the non-conductive material 106 at the bottom or rear portion of the packaged semiconductor structure/element is removed, preferably by milling inwardly from a rear or bottom surface thereof to create a blind hole or cavity 108 at the bottom of which is exposed a conductive portion 110 of the lead frame 102.

Although milling with an end cutter of suitable size is the preferred and probably the most convenient way of removing the non-conductive material 106 to expose lead frame portion 110, any other method or process by which such removal of non-conductive material and consequential exposure of a rear conductive portion of the lead frame is obtained is acceptable for purposes of practicing the present invention.

Figure 2:
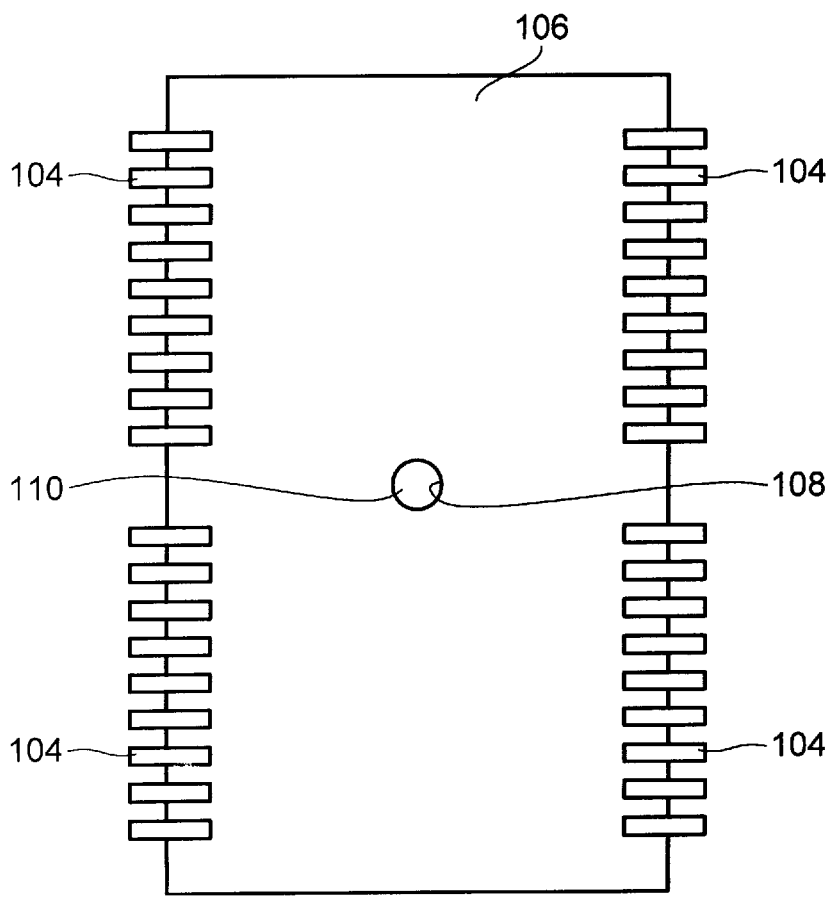
FIG. 2 is a rear plan view of the SOJ per FIG. 1., to clearly show the milled hole formed through the rear surface thereof to the lead frame within.

FIG. 2 is a rear plan view of the packaged semiconductor element 100. Such elements may have dimensions which may typically range in fractions of centimeters or inches, and only a relatively small diameter end mill bit will be needed to generate the blind hole 108 as described above. The actual physical removal of the non-conductive material can be readily accomplished by turning the packaged semiconductor element 100 on its normally upper surface and drilling downward with the end mill bit. Since the semiconductor material very likely will have a different consistency and physical strength as compared with the material of the lead frame contained within, the operator performing the milling operation should be able to readily determine when the end of the rotary mill bit starts to bite into the lead frame because of the change in sound and/or feel as the milling proceeds. This portion of the process of preparing the semiconductor element 100 can be readily accomplished without physical stress on and/or permanent deformation of any other portion of the semiconductor element 100, particularly, the relatively fragile leads 104, 104 on both sides.

FIG. 3 is a top plan view of the exemplary semiconductor device 100, with the non-conductive packaging material 106 removed from the top portion thereof to expose (without showing of all details) the lead frame 102 and various leads 302 which under normal circumstances would be attached to various contact pads 300, 300 formed on lead frame 102. Note, however, that such a process of removing non-conductive material 106 to expose portions of the semiconductor structure/element for a detailed analysis thereof very likely will cause some breaks between, for example, lead wires 302 and corresponding contact pads, 304, 304. Such destruction of the structure to be analyzed is clearly undesirable and bound to frustrate meaningful analysis. This is a reason why, according to the present invention, the non-conductive material 106 is removed from the rear or underside of the packaged semiconductor device 100 to expose a conductive portion of the lead frame 102, i.e., none of the semiconductor structure and/or lead lines, contact pads, formed on the lead frame 102 are physically disturbed in any way. What is most important is that it is not necessary to depend on grounding individual lead lines 302, 302 which have broken away from their corresponding contact pads 304, 304 in order to have the device operatively grounded from beneath while analysis is conducted of the exposed portion above. Removal of the non-conductive material 106 from the top portion of the semiconductor device 300 to create the relatively large open hole 306 may be accomplished by any known technique, e.g., mechanical removal or even chemical etching away of the non-conductive material.

As best seen in FIG. 4 in partial sectional end view of a first preferred embodiment of this invention, a conformable electrically conductive material 400, e.g., conductive tape, is forced into hole 108 until a portion thereof at 402 makes electrical grounding contact with exposed portion 110 of lead frame 102, while an additional portion of the material 400 extending outside of hole 108 is conformably forced into contact with an upper surface 404 of a grounded mounting element 406 at 408. Thus, once hole 108 has been formed, and the non-conductive material removed from the top of SOJ 100, enough of electrically conductive material 400 is provided in hole 108 so that when SOJ 100 is pressed to surface 404 of grounding pad 406 there will be forcible deformation of electrically conductive material 400 to ensure a good electrically conducting contact between the exposed surface 110 of lead frame 102 at one end and surface 404 of electrically conducting grounding pad 404 at an opposite end thereof.

Although conductive tape is highly suitable for use as the material 400, another readily available alternative material is electrically conductive epoxy paint. FIG. 5 omits some of the details of the SOJ structure shown in FIGS. 1–4, but is intended thereby to focus attention on the fact that the blind hole 108 is formed to expose a portion 110 of lead frame 102 exactly as before. In this embodiment, a quantity of an electrically conductive epoxy paint-like material 500 is filled into hole 108 in a quantity sufficient to ensure contact thereby with exposed portion 110 of lead frame 102 at 502 and, also, simultaneously, at 504 with upper surface 404 of electrically conducting grounding pad 406. The electrically conducting epoxy material, being of a thick viscous liquid form, once provided in sufficient quantity works very effectively to ground the lead frame 102 to the grounding pad 406.

In both embodiments, i.e., the one per FIG. 4 employing conductive tape 400 as the electrically conducting conformable material filled into hole 108, and the one per FIG. 5 employing electrically conductive epoxy material instead, the SOJ is held to the electrically conducting grounding pad 406 in any convenient manner, e.g., by a length of electrically conducting tape 450.

Note that in the arrangements per each of FIGS. 3, 4 and 5, some of the bond wires may not be attached to the die after deprocessing of the device 100. In other words, some of the leads 104 may be ground off so that the device can lie flat against the mounting element 406, as indicated best in FIG. 5.

As noted earlier, certain well-known apparatus/techniques for performing the desired analysis of the semiconductor structure formed on the leadtframe in a packaged SOJ are available, including scanning electron microscope (SEM), focused ion beam (FIB) and reactive ion etch (RIE). When either of embodiments per FIGS. 4 and 5, as described above, is employed to ground the lead frame 102 of SOJ 100, there is virtually no deleterious charging of the structure being analyzed due to the presence of ions, or other charging mechanisms, in analysis with any of these techniques. These methods are considered superior to sputtering on a conductive coating on the SOJ under investigation since the coating represents a major alteration of the structure being analyzed.

However, for RIE application, it is preferable to employ a grounding pad 406 provided with an upwardly extending pin or spring made of an electrically conductive material which will make forcible contact with exposed portion 110 of lead frame 102 when SOJ 100 is held in place using clamps rather than being taped by electrically conductive carbon tape 450 for purposes of analysis. It is well-known that contaminants such as conductive carbon tape are not permissible in the RIE chamber. The subsequent deprocessing of the semiconductor chip in the RIE application results in significantly reduced charging effects thus lessens the risk of damaging the structure as it is being deprocessed.

Yet another application in which the present invention is considered especially effective is one involving Energy Dispersive X-ray (EDX) analysis when the electron beam voltage utilized is above 10KV.

Figure 6:
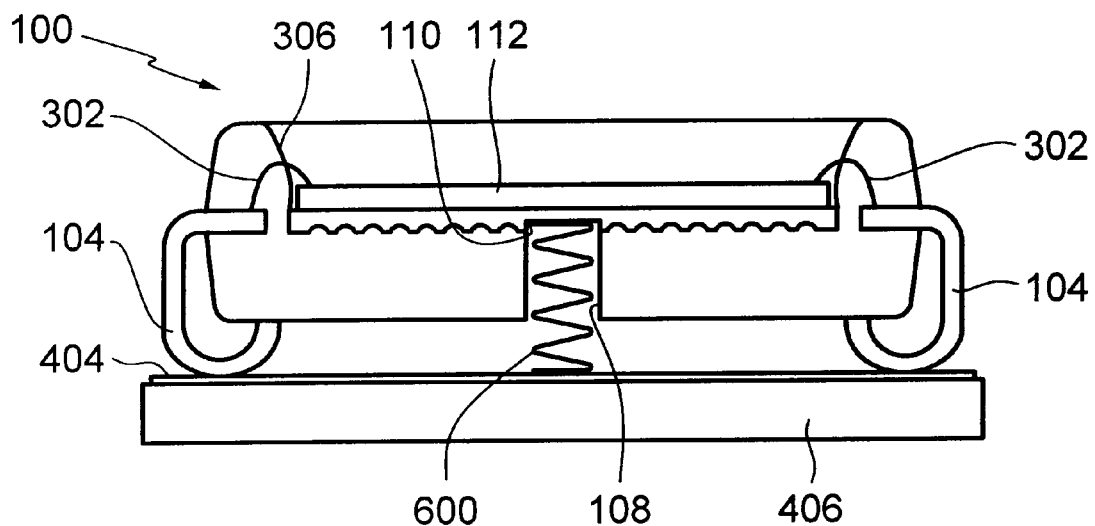
FIG. 6 is a transverse cross-sectional view of a SOJ per FIG. 1 with an elastic electrically conducting spring contact element extending via the milled hole to provide a grounding path between a stage mount or grounding element and the lead frame of the device mounted thereon.

FIG. 6 shows yet another alternative, one in which a small, preferably helical, electrically conductive spring element 600 is in contact with upper surface 404 at one end and with exposed bottom portion 110 of hole 108 at its other end. The designed electrical grounding contact thus is provided through spring element 600 the size, elasticity, shape, and material of which may be selected by the user as deemed most appropriate for particular applications.

Figure 7:
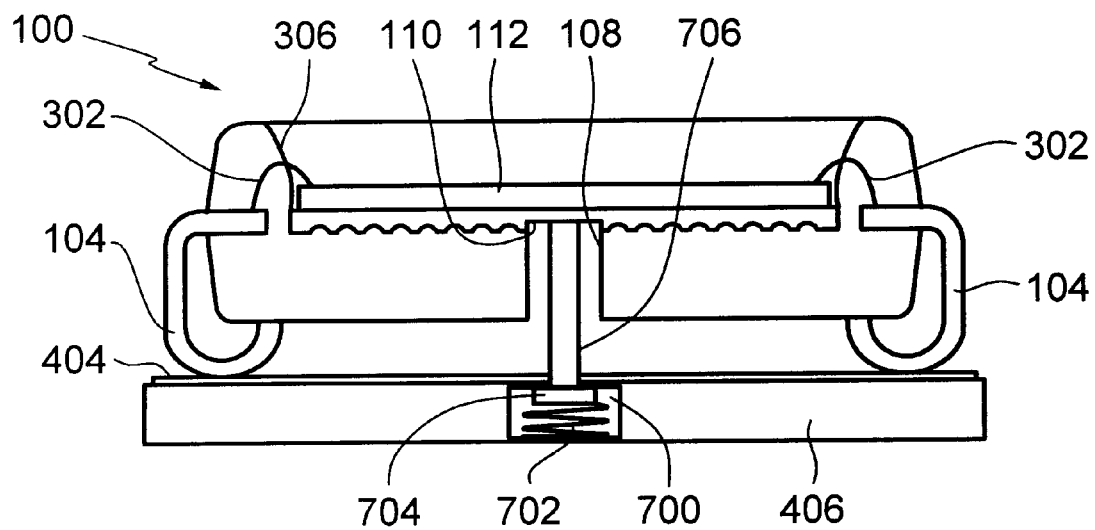
FIG. 7 is a transverse cross-sectional view of a SOJ per FIG. 1 with an elastically mounted electrically conducting pin contact element extending via the milled hole to provide a grounding path between a stage mount or grounding element and the lead frame of the device mounted thereon.

FIG. 7 shows yet another alternative, wherein grounding pad 406 is formed to have a recess or cavity 700 within which is elastically supported, e.g., by a spring element 702, a base 704 of a preferably thin-like element 706 a distal end of which makes electrical contact with exposed portion 110 of hole 108. Electrical grounding contact between lead frame 102 and grounding pad 406 is thus provided via electrically conductive pin-like portion 706, a space 704, and the related electrically conductive support 702. The shape, size, elasticity of its support, and material of the pin-like portion 706 and base 704, etc., are mere matters of design choice to be exercised by the user for each particular circumstance of use. Note that the spring support 702 does not have to be a helical spring element, but may be any electrically conductive element which possesses sufficient elasticity to ensure good electrical contact for grounding purposes.

In summary, the present invention provides several alternative ways of very quickly and effectively grounding the lead frame contained within a SOJ to permit safe and effective analysis of the semiconductor structure contained within the SOJ by any known technique. The disclosed process, in all of its embodiments, requires very little actual effort and thus saves time, and reduces errors of the type hitherto known in such analytical activity.

As persons of ordinary skill in the art will readily appreciate, the use of electrically conductive tape or electrically conductive epoxy material represents only two preferred alternatives. The use of an elastically compressed pin or spring, represents other alternatives. Such persons will no doubt consider yet other alternatives, hence the scope of this invention is considered to cover all such obvious variations so long as a blind hole is drilled into non-conductive packaging material to expose a portion of a lead frame or its equivalent on which a semiconductor structure is formed and is to be so that direct electrical grounding between the exposed portion of the lead frame or semiconductor chip and a grounded mounting element is obtained.

Although the present invention has been described and illustrated in detail, it should be clearly understood that the same is by way of illustration and example only and is not to be taken by way of limitation, the spirit and scope of the present invention being limited only by the terms of the appended claims.

What is claimed is:

1. A grounded semiconductor device, comprising:

a lead frame;

a semiconductor chip mounted on said lead frame;

a package of non-conductive packaging material for embedding said semiconductor chip therein, the package having top and bottom surfaces and the package being arranged for mounting at its bottom surface;

the bottom surface having an aperture extending through the package to said lead frame; and electrically conductive conforming material in the aperture, the electrically conductive material extending from the bottom surface of said package into contact with said semiconductor chip and establishing an electrical ground connection thereto, wherein the electrically conductive material comprises a helical spring.

* * * * *